United States Patent [19]

Cooper et al.

[11] Patent Number: 4,477,142
[45] Date of Patent: Oct. 16, 1984

[54] FASTENER

[75] Inventors: Ralph M. Cooper, Clemmons; Warren J. Pegram, Kernersville, both of N.C.

[73] Assignee: AMP Incorporated, Harrisburg, Pa.

[21] Appl. No.: 480,043

[22] Filed: Mar. 29, 1983

[51] Int. Cl.³ .............................................. H02B 1/02
[52] U.S. Cl. .............................. 339/125 R; 339/12 B
[58] Field of Search ............... 339/125 R, 126 R, 128, 339/176 M, 176 MP; 411/508, 509; 24/297, 453

[56] References Cited

U.S. PATENT DOCUMENTS 3,154,281 10/1964 Frank ............................... 339/126 R
4,195,900 4/1980 Hughes ............................ 339/125 R
4,274,691 6/1981 Abernathy et al. .............. 339/126 R

FOREIGN PATENT DOCUMENTS 1423909 11/1965 France ................................. 339/128
2237332 2/1975 France ............................. 339/125 R Primary Examiner—Eugene F. Desmond
Attorney, Agent, or Firm—Robert W. J. Usher

[57] ABSTRACT

A fastener for mounting in a panel aperture including a body portion from which depends a mounting post slotted to provide a C-spring cross-section. Surface portions of the post adjacent each side of the slot and aligned with an envelope defined by the body sides are formed with upwardly facing latching shoulders which are located only outside the envelope.

3 Claims, 7 Drawing Figures

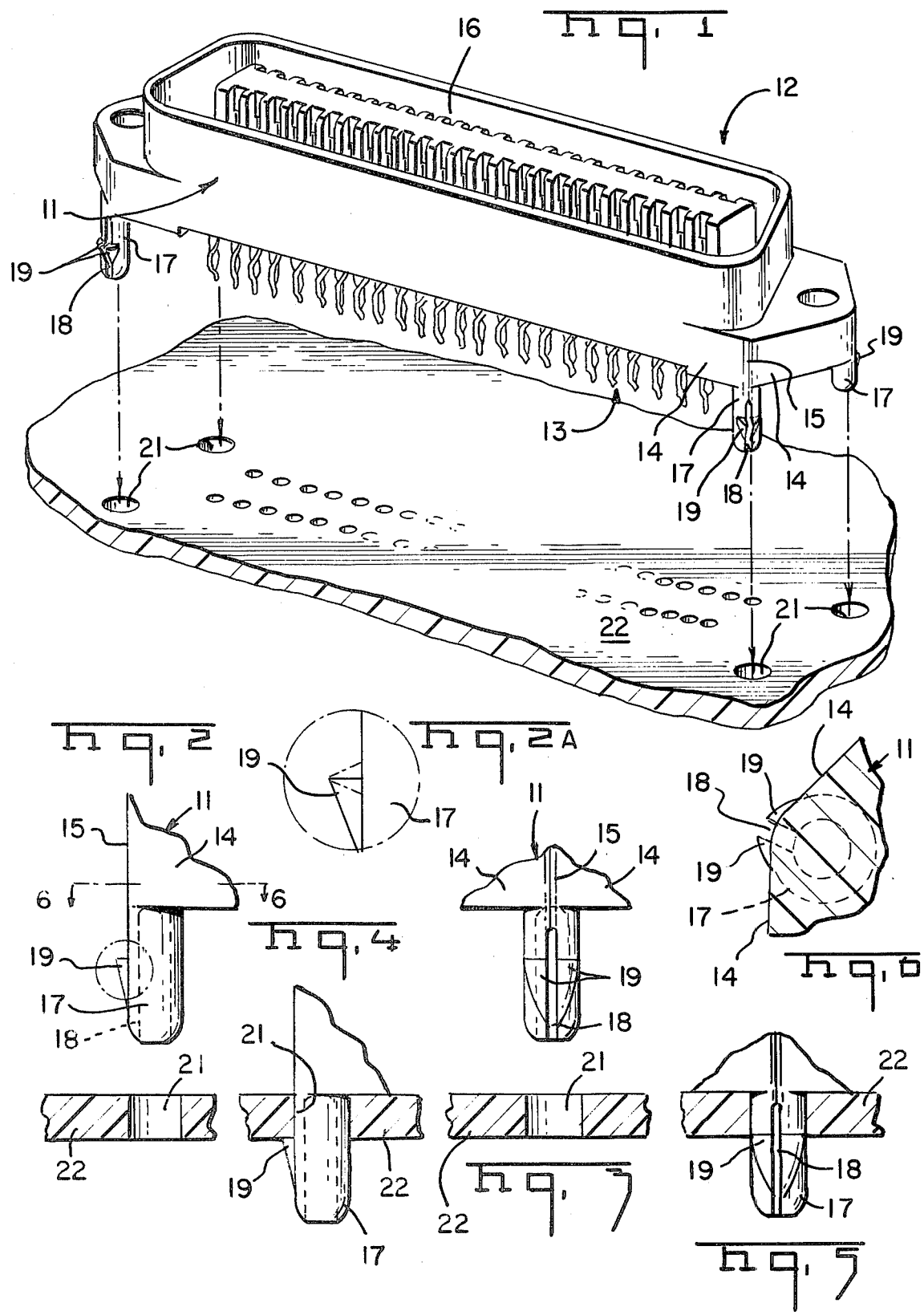

FASTENER

The invention relates to a fastener for mounting in an aperture in a panel such as a printed circuit board.

It is known to provide fasteners for mounting in apertures in printed circuit boards which fasteners include mounting posts with overlying oppositely facing board engaging faces joined by necks received in the apertures. However, a disadvantage of such prior fasteners is that they cannot be manufactured using a straight draw mould having an axis of movement parallel to the post axis. Where the post extends from a housing body having a recess opening away from the printed circuit board, the body may only be integrally moulded with the post by a relatively complex and slow moulding technique using lateral core pins which greatly increases the production cost.

It is an object of the invention to provide a fastener for mounting in an aperture in a printed circuit board which can be manufactured using a straight drawn mould operative along the direction of the post axis and yet which fastener will provide a stable mounting in a panel aperture.

According to the invention, there is provided a fastener moulded in one piece from resilient insulating material comprising a body portion having upper and lower faces, and side faces, the peripheries of which define an envelope extending perpendicularly to the upper and lower faces, a tubular mounting post depending from the lower face and being formed with a slot extending along a side portion of the post adjacent a side face so that the post has a transverse cross-section of a C-spring, surface portions of the post adjacent each side of the slot and aligned with the envelope being formed with upwardly facing latching shoulders located only outside the envelope.

The fastener may be incorporated in an electrical connector housing having a socket opening to the upper face.

The fastener and connector housing can be moulded using a relatively simple straight draw mould and yet the resiliency of the post permits good engagement with the entire periphery of the panel aperture providing a stable mounting characteristic.

Preferably, the post is adjacent a corner of the body portion so that the shoulders extend in transverse directions. This provides a particularly stable mounting.

An example of an electrical connector housing according to the invention, will now be described with reference to the accompanying drawings in which:

FIG. 1 is a perspective view of the connector housing aligned for mounting in a printed circuit board;

FIG. 2 is a fragmentary front view of a mounting post;

FIG. 2A is an enlargement of the portion circled in FIG. 2;

FIG. 3 is a fragmentary side view of the mounting post;

FIGS. 4 and 5 are fragmentary front and side views, respectively, of the post mounted in a panel aperture; and, FIG. 6 is a fragmentary cross-sectional view taken along line 6—6 of FIG. 2.

The connector housing is moulded in one piece from plastics material and comprises a body 11 having an upper face 12, a lower face 13 and side faces 14, the periphery of which define an envelope extending perpendicularly to the upper and lower faces. A mating socket 16 opens to the upper face 12. A tubular mounting post 17 depends from a lower face adjacent each corner 15 defined at the junction of the side faces 14 of the body portion. A slot 18 extends upwardly from the free end of the post along a side of the post adjacent the face 14 to define a C-spring cross-section. Surface portions of the post adjacent each side of the slot 18 and aligned with the envelope are formed with upwardly facing latching shoulders 19 located only outside the envelope.

The connector housing can be mounted on a printed circuit board 22 by pushing the posts into apertures 21 in the board until the shoulders engage the lower face of the board in a snap action with the posts received in an interference fit. A firm and stable mounting is achieved in spite of differences in aperature diameter (within limits) as a result of the resiliency of the posts. The C-section ensures that the entire periphery of each post engages the internal periphery of the board aperture ensuring a stable mounting even when the shoulders are relatively small.

As the shoulders 19 are only in locations outside the envelope containing the lateral periphery of the body portion, undercuts are avoided enabling the connector to be manufactured using a straight draw moulding technique.

As illustrated in broken lines in FIG. 2A, the shoulder may be formed with a positive or negative angle of rake to enable firm engagement with the board in spite of variations in board and housing dimensions arising, for example, as a result of moulding tolerances.

We claim:

1. A fastener moulded in one piece from resilient insulating material comprising a body portion having upper and lower faces, and side faces, the peripheries of which define an envelope extending perpendicularly to the upper and lower faces, a tubular mounting post depending from the lower face and being formed with a slot extending along a side portion of the post adjacent a side face so that the post has a transverse cross-section of a C-spring, surface portions of the post adjacent each side of the slot and aligned with the envelope being formed with upwardly facing latch shoulders located only outside the envelope.

2. A fastener according to claim 1 in which the post is adjacent a corner of the body portion so that the shoulders extend in transverse directions.

3. An electrical connector housing moulded in one piece from resilient insulating material and comprising a body portion having upper and lower faces, and side faces, the peripheries of which define an envelope extending perpendicularly to the upper and lower faces, and a socket opening to the upper face, a tubular mounting post depending from the lower face and being formed with a slot extending along a side portion of the post adjacent a side face so that the post has a transverse cross-section of a C-spring, surface portions of the post adjacent each side of the slot and aligned with the envelope being formed with upwardly facing latching shoulders located only outside the envelope.

* * * * *